US008278956B2

(12) United States Patent
Losey et al.

(10) Patent No.: US 8,278,956 B2
(45) Date of Patent: Oct. 2, 2012

(54) PROBECARD SYSTEM AND METHOD

(75) Inventors: Matt Losey, Rancho Cucamonga, CA (US); Melvin Khoo, San Gabriel, CA (US); Yohannes Desta, Arcadia, CA (US); Chang Huang, Arcadia, CA (US)

(73) Assignee: Advantest America, Inc, San Jose, CA (US)

( * ) Notice: Subject to any disclaimer, the term of this patent is extended or adjusted under 35 U.S.C. 154(b) by 418 days.

(21) Appl. No.: 12/756,578

(22) Filed: Apr. 8, 2010

(65) Prior Publication Data

US 2011/0248735 A1    Oct. 13, 2011

(51) Int. Cl.
*G01R 31/00* (2006.01)

(52) U.S. Cl. ......... 324/756.03; 324/754.07; 324/754.03; 324/757.01; 324/757.02

(58) Field of Classification Search .................. 324/757, 324/754.07, 756.03, 757.01, 754.03, 754.01, 324/754.08, 750.19
See application file for complete search history.

(56) References Cited

U.S. PATENT DOCUMENTS

| | | | |
|---|---|---|---|
| 2006/0061375 A1* | 3/2006 | Mori | 324/754 |
| 2009/0146675 A1* | 6/2009 | Karklin et al. | 324/758 |
| 2009/0206860 A1* | 8/2009 | McFarland et al. | 324/758 |
| 2010/0134129 A1* | 6/2010 | Breinlinger et al. | 324/760 |
| 2010/0225344 A1* | 9/2010 | Eldridge et al. | 324/754 |
| 2011/0128029 A1* | 6/2011 | Hobbs et al. | 324/756.03 |
| 2012/0025858 A1* | 2/2012 | Namiki et al. | 324/750.19 |

* cited by examiner

*Primary Examiner* — Huy Q Phan
*Assistant Examiner* — Thang Le
(74) *Attorney, Agent, or Firm* — Manuel F. de la Cerra

(57) ABSTRACT

A microelectronic contactor assembly can include a probe head having microelectronic contactors for contacting terminals of semiconductor devices to test the semiconductor devices. A stiffener assembly can provide mechanical support to microelectronic contactors and for connecting a probe card assembly to a prober machine. A stiffener assembly may include first and second stiffener bodies that are connected together at their central portions with adjustment mechanisms such as three differential screw mechanisms. A probe head may be attached to a first stiffener body at locations outside its central portion, while a prober machine may be attached to a second stiffener body at locations outside its central portion. The first and second stiffener bodies may have different coefficients of thermal expansion. The stiffener assembly allows for differential thermal expansion of various components of the microelectronic contactor assembly while minimizing accompanying dimensional distortion that could interfere with contacting the terminals of semiconductor devices. The adjustment mechanisms allow for quick, sensitive adjustment of the positions of microelectronic contactors relative to semiconductor devices to be tested.

19 Claims, 5 Drawing Sheets

PROBECARD SYSTEM AND METHOD

BACKGROUND

Typically, semiconductor chips are tested to verify that they function appropriately and reliably. This is often done when the semiconductor chips are still in wafer form, that is, before they are diced from the wafer and packaged. This allows the simultaneous testing of many semiconductor chips in parallel, creating considerable advantages in cost and process time compared to testing individual chips once they are packaged. If chips are found to be defective, they may be discarded when the chips are diced from the wafer, and only the reliable chips need be packaged. Semiconductor chips may also be tested after dicing, but before packaging by assembling die on tape or a mechanical carrier.

Generally, modern microfabricated (termed MEMS) microelectronic contactor assemblies, including probe card assemblies for testing semiconductors, have at least three components: a printed circuit board (PCB), a substrate to which thousands of microelectronic contactors are coupled (which substrate may be referred to as the "probe contactor substrate"), and a compressible electrical interconnect (often in the form of an electrical "interposer"). The compressible electrical interconnect electrically connects the individual electrical contacts of the PCB to corresponding electrical contacts on the probe contactor substrate, which probe contactor substrate then relays signals to individual microelectronic contactors. The combination of the probe contactor substrate and its microelectronic contactors is sometimes referred to as a probe head.

The microelectronic contactors on the probe contactor substrate often have a very fine pitch (i.e., small distances between contactors, such as 30 μm to 200 μm) while the electrical contacts of the PCB and the interposer often have coarser pitches (>200 μm). Thus, in modern MEMS probe card assemblies, the probe contactor substrate often provides a space transformation of electrical contracts as it connects the finely pitched microelectronic contactors to the coarser pitched electrical contacts found on the interposer and PCB. Alternately, part or all of this space transformation may be off-loaded to a separate space transformer substrate of the probe head, or to other substrates or components. It is noted that some probe card assemblies do not utilize an interposer, but the general idea is unchanged.

In most applications, the required number of interconnects that need to be made between the substrates of a probe card assembly are in the thousands or tens of thousands, dictating that the PCB and the probe head be parallel (or very close to parallel), and in close proximity, so that the many interconnects therebetween can be reliably made. It is also noted that the vertical space between the PCB and the probe contactor substrate is generally constrained to only a few millimeters.

So that reliable connections to a wafer or other array of semiconductor devices can also be made, it is also important that the tips of the microelectronic contactors on the probe head lie essentially in a plane. U.S. Pat. No. 7,180,316, titled "Probe Head with Machined Mounting Pads and Method of Forming Same," discusses the importance of the planarity of the microelectronic contactor tips (or probe tips), and is hereby incorporated herein by reference in its entirety.

It is often advantageous to test semiconductor chips to verify that they function appropriately and reliably at specific temperatures or over a range of temperatures. But exposing the various components of the probe head to varying temperatures during testing can cause dimensional changes that interfere with the planarity of the tips of the microelectronic contactors, which tends to impair the reliability of the connections to the wafer. One attempt to address this issue was described in U.S. Pat. No. 7,592,821, titled "Apparatus and Method for Managing Thermally Induced Motion of a Probe Card Assembly," which patent is hereby incorporated herein by reference in its entirety. As shown in that patent and reproduced here for convenience, FIG. 1A illustrates an exemplary prior art probing system used to test dies (not shown) on a newly manufactured semiconductor wafer 112 or other electronic devices. The probing system of FIG. 1A includes a test head 104 and a prober 102 (which is shown with a cut-away 126 to provide a partial view of the inside of the prober 102). To test the dies (not shown) of the semiconductor wafer 112, the wafer 112 is placed on a moveable stage 106 as shown in FIG. 1A, and the stage 106 is moved such that terminals (not shown) on dies (not shown) of the wafer 112 are brought into contact with probes 124 of a probe card assembly 108. Temporary electrical connections are thus established between the probes 124 and dies (not shown) of the wafer 112 to be tested.

Typically, a cable 110 or other communication means connects a tester (not shown) with the test head 104. Electrical connectors 114 electrically connect the test head 104 with the probe card assembly 108. The probe card assembly 108 shown in FIG. 1A includes a wiring board 120, which can provide electrical connections from connectors 114 to the probe substrate 122, and the probe substrate can provide electrical connections to the probes 124.

The cable 110, test head 104, and electrical connectors 114 thus provide electrical paths between the tester (not shown) and the probe card assembly 108, and the probe card assembly 108 extends those electrical paths to the probes 124. Thus, while the probes 124 are in contact with the terminals (not shown) of the dies (not shown) on the wafer 112, cable 110, test head 104, electrical connectors 114, and probe card assembly 108 provide a plurality of electrical paths between the tester (not shown) and the dies (not shown). The tester (not shown) writes test data through these electrical paths to the dies (not shown), and response data generated by the dies (not shown) in response to the test data is returned to the tester (not shown) through these electrical paths.

To test the dies (not shown) of the wafer 112 at specific temperatures or over a range of temperatures, heating elements or cooling elements (not shown) may be included in the stage 106 or at other locations in the prober 102 to heat or cool the wafer 112 during testing. Even if heating elements or cooling elements (not shown) are not used, operation of the dies (not shown) of the wafer 112 may generate heat. Such heating or cooling from either heating/cooling elements (not shown) or from operation of the dies (not shown) may cause the wafer 112 and the probe substrate 122 to expand or contract, changing the positions of the probes 124 and the terminals (not shown) on the wafer 112, which may cause misalignment between the probes 124 and terminals (not shown) in a plane that is generally horizontal in FIG. 1A. (This horizontal plane is in the directions labeled "x, y" in FIG. 1A and will hereinafter be referred to as "x, y" movement. In FIG. 1A, the direction labeled "x" is horizontal across the page, the direction labeled "y" is horizontal into and out of the page, and the direction labeled "z" is vertical. These directions are relative and for convenience and are not to be taken as limiting.) If such "x, y" misalignment becomes too great, the probes 124 will no longer be able to contact all of the terminals (not shown).

The use of heating elements or cooling elements (not shown) to heat or cool the wafer 112 during testing, and/or the generation of heat by the dies of the wafer 112 as they are tested, may also cause a thermal gradient between the side of the probe card assembly 108 that faces the wafer 112 (hereinafter a side of the probe card assembly that faces the wafer 112 will be referred to as the "front-side" or the "wafer-side") and the opposite side of the probe card assembly (hereinafter the opposite side of the probe card assembly will be referred to as the "back-side" or the "tester side"). Such thermal gradients can cause the probe card assembly 108 to bow or warp. If such bowing is towards the wafer 112, the probe card assembly 108 may press against the wafer 112 with too much force and damage the wafer 112 or probe card assembly 108. If such bowing is away from the wafer 112, some or all of the probes 124 may move (in a generally vertical direction with respect to FIG. 1A) out of contact with the terminals (not shown) on the wafer 12. If the probes 124 do not contact the terminals (not shown), the dies (not shown) on the wafer 112 will falsely test as failed. (Movement to or away from the wafer 112 is labeled the "z" direction in FIG. 1A and will hereinafter be referred to as "z" movement.)

Typically, the probe substrate 122 is attached directly to the wiring board 120, which in turn is attached to a test head plate 121 on the prober 102. A shown in FIG. 1B, the test head plate 121 forms an opening 132 in the prober 102 into which the probe substrate 122 fits (as generally shown in FIG. 1A). The test head plate 121 may include holes 134 for bolts that secure the probe card assembly 108 to the test head plate 121. (Clamping or techniques other than bolting may be used to attached the probe card assembly 108 to the test head plate 121.) The wiring board 120 is typically made of a printed circuit board material, which is particularly susceptible to thermally induced "x, y" and "z" movements.

In view of these issues, U.S. Pat. No. 7,592,821 described an approach to counteracting thermally induced movements of a probe card assembly. As generally described with respect to FIGS. 2A-3B and FIGS. 6-7B in that patent, a system was discussed where a probe card was backed by a wiring substrate (e.g., printed circuit board), all backed by a stiffener plate that could itself be further backed by a reinforcing truss structure. When the probe card was used for temperature testing and faced heated semiconductor chips, the probe card and adjacent wiring substrate would be exposed to more heat than the more distant and shielded stiffener plate, which itself was exposed to more heat than the still more distant and further shielded reinforcing truss. A thermal gradient was thus created from the front "probe card" side to the back "reinforcing truss" side of the probe card assembly.

U.S. Pat. No. 7,592,821 taught selecting materials for the probe head assembly, stiffener plate, and truss structure so that each expands or contracts by the same amount when exposed to the different amounts of heat. That is, the probe head assembly was urged to be made of a material with a low coefficient of thermal expansion such that it expands approximately a specified distance "d" in response to its expected temperature in the temperature gradient. The stiffener plate, which would be at a lower temperature than the probe head assembly, was taught to be made of a material with a higher coefficient of thermal expansion so that it also expands the same specified distance "d" in response to its (lower) expected temperature in the temperature gradient. And the truss structure, which would be at an even lower temperature than the stiffener plate, was suggested to be made of a material with an even higher coefficient of thermal expansion so that it also expands the same specified distance "d" in response to its (even lower) expected temperature in the temperature gradient.

In practice, however, the exact temperature gradient usually cannot be known, especially ahead of time, and there are a limited number of materials available for use as the various components (i.e., there is a limited choice of coefficients of thermal expansion), so the probe card assembly described in U.S. Pat. No. 7,592,821 is still prone to thermally induced "x, y" and "z" movements, including deformation, bending, warping, etc., due to differential expansion at various temperatures of different materials that are mechanically constrained or fused together. Improved techniques for minimizing thermally induced movements of a probe card assembly are thus desirable, as well as improved techniques for counteracting any such movements that do occur.

SUMMARY

The following summary is provided to show examples of the invention and not to define or otherwise limit the scope of the invention.

Provided is an example method for maintaining contact between a plurality of microelectronic contactors and terminals of semiconductor devices, including the steps of coupling a probe card assembly to a prober machine for testing semiconductor devices, where the probe card assembly may include: microelectronic contactors attached to a probe head for contacting terminals of semiconductor devices to test the semiconductor devices, and a stiffener assembly for providing mechanical support to the microelectronic contactors and for connecting the probe card assembly to the prober machine. A stiffener assembly may include a first stiffener body with a first central portion and a second stiffener body with a second central portion, the first stiffener body and the second stiffener body being mechanically connected together in only the first central portion and the second central portion. A probe head may be attached to the first stiffener body at a plurality of locations outside the first central portion of the first stiffener body, while the second stiffener body may be attached to the prober machine at a plurality of locations outside the second central portion of the second stiffener body. Such a method may also include the step of causing the probe head and the first stiffener body to which the probe head is attached to expand or contract thermally a first percentage substantially in a first plane so that the ones of the probes and the ones of the terminals of the semiconductor devices maintain sufficient alignment to maintain said contact as the semiconductor devices expand or contract thermally, while simultaneously causing the second stiffener body which is attached to the prober machine to expand or contract thermally a second percentage substantially in a second plane substantially parallel to the first plane. The second percentage may be more, less or the same as the first percentage.

In these and other embodiments, the first stiffener body and the second stiffener body may be mechanically connected together with at least one adjustment mechanism, and the method may include the step of adjusting the position of the first stiffener body relative to the second stiffener body using the at least one adjustment mechanism. Alternatively, three mechanisms can be provided, and those three mechanisms may include differential screw mechanisms for adjusting the position of the first stiffener body relative to the second stiffener body.

Also provided is an example microelectronic contactor assembly that may include a probe head comprising a plurality of microelectronic contactors for contacting terminals of semiconductor devices to test the semiconductor devices, the plurality of microelectronic contactors being attached to a probe head; a stiffener assembly for providing mechanical support to the microelectronic contactors and for connecting the probe card assembly to a prober machine, the stiffener assembly comprising a first stiffener body with a first central portion and a second stiffener body with a second central portion, the first stiffener body and the second stiffener body being mechanically connected together in only the first central portion and the second central portion. The probe head may be attached to the first stiffener body at a plurality of locations outside the first central portion of the first stiffener body, while the second stiffener body may be adapted to be attached to the prober machine at a plurality of locations outside the second central portion of the second stiffener body. A circuit board may disposed between the probe head and the first stiffener, and a compressible electrical interconnect may be disposed between the probe head and the circuit board, wherein the compressible electrical interconnect providing electrical interconnections between the probe head and the circuit board.

In these and other embodiments, the first stiffener body may have a lesser, greater or the same coefficient of thermal expansion as the second stiffener body. The first stiffener body and the second stiffener body may be mechanically connected together with at least one adjustment mechanism. Alternatively, three mechanisms can be provided, and those three mechanisms may include differential screw mechanisms for adjusting the position of the first stiffener body relative to the second stiffener body.

Also provided is an example method of adjusting the position of a plurality of microelectronic contactors relative to a prober machine for testing semiconductor devices, the method including the first step of coupling a probe card assembly to a prober machine for testing semiconductor devices, the probe card assembly including a plurality of microelectronic contactors for contacting terminals of semiconductor devices to test the semiconductor devices, the plurality of microelectronic contactors being attached to a probe head; a stiffener assembly for providing mechanical support to the microelectronic contactors and for connecting the probe card assembly to the prober machine, the stiffener assembly comprising a first stiffener body with a first central portion and a second stiffener body with a second central portion, the first stiffener body and the second stiffener body being mechanically connected together in only the first central portion and the second central portion with three approximately equally-spaced adjustment mechanisms that comprise differential screw mechanisms; the probe head being attached to the first stiffener body at a plurality of locations outside the first central portion of the first stiffener body; the second stiffener body being attached to the prober machine at a plurality of locations outside the second central portion of the second stiffener body. The method may also include the step of adjusting the position of the first stiffener body relative to the second stiffener body using at least one of the differential screw mechanisms.

Figure 1A:
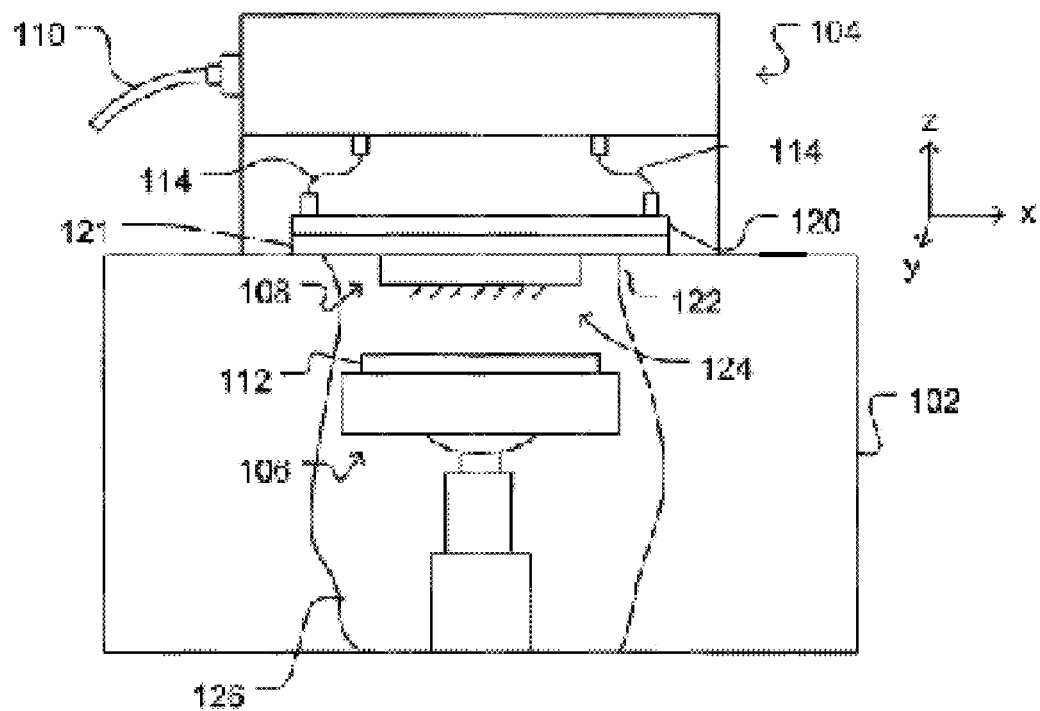
FIG. 1A shows a side view of an exemplary prior art prober, test head, and probe card assembly. A cut-out provides a partial view of the inside of the prober.

It is noted that, in the following description, like reference numbers appearing in different drawing figures refer to like elements/features. Often, therefore, like elements and features that appear in different drawing figures will not be described in detail with respect to each of the drawing figures.

DETAILED DESCRIPTION

This specification describes exemplary embodiments and applications of the invention. The invention, however, is not limited to these exemplary embodiments and applications or to the manner in which the exemplary embodiments and applications operate or are described herein.

Figure 1B:
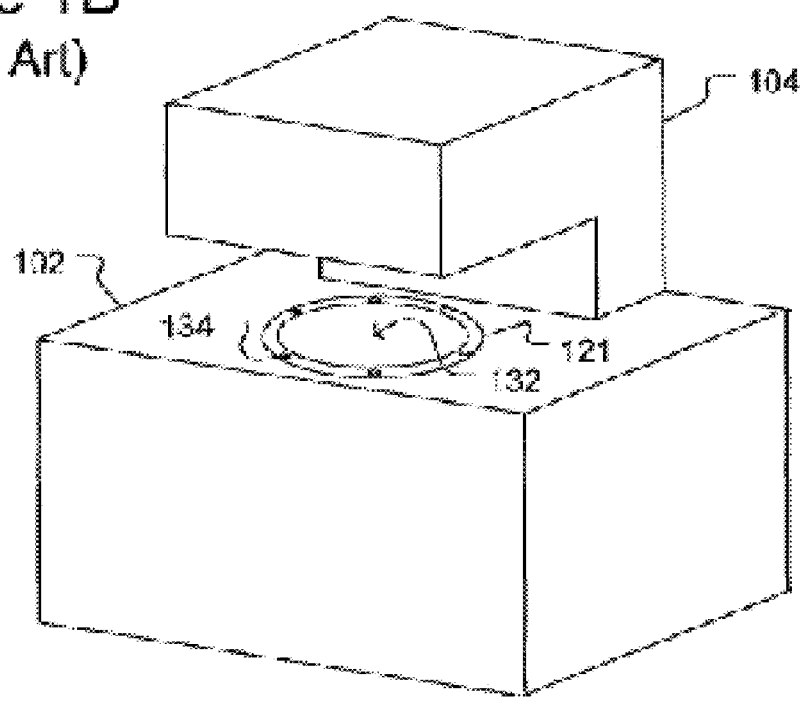
FIG. 1B shows a perspective view of the prober and test head of FIG. 1A without a probe card assembly.
Figure 2:
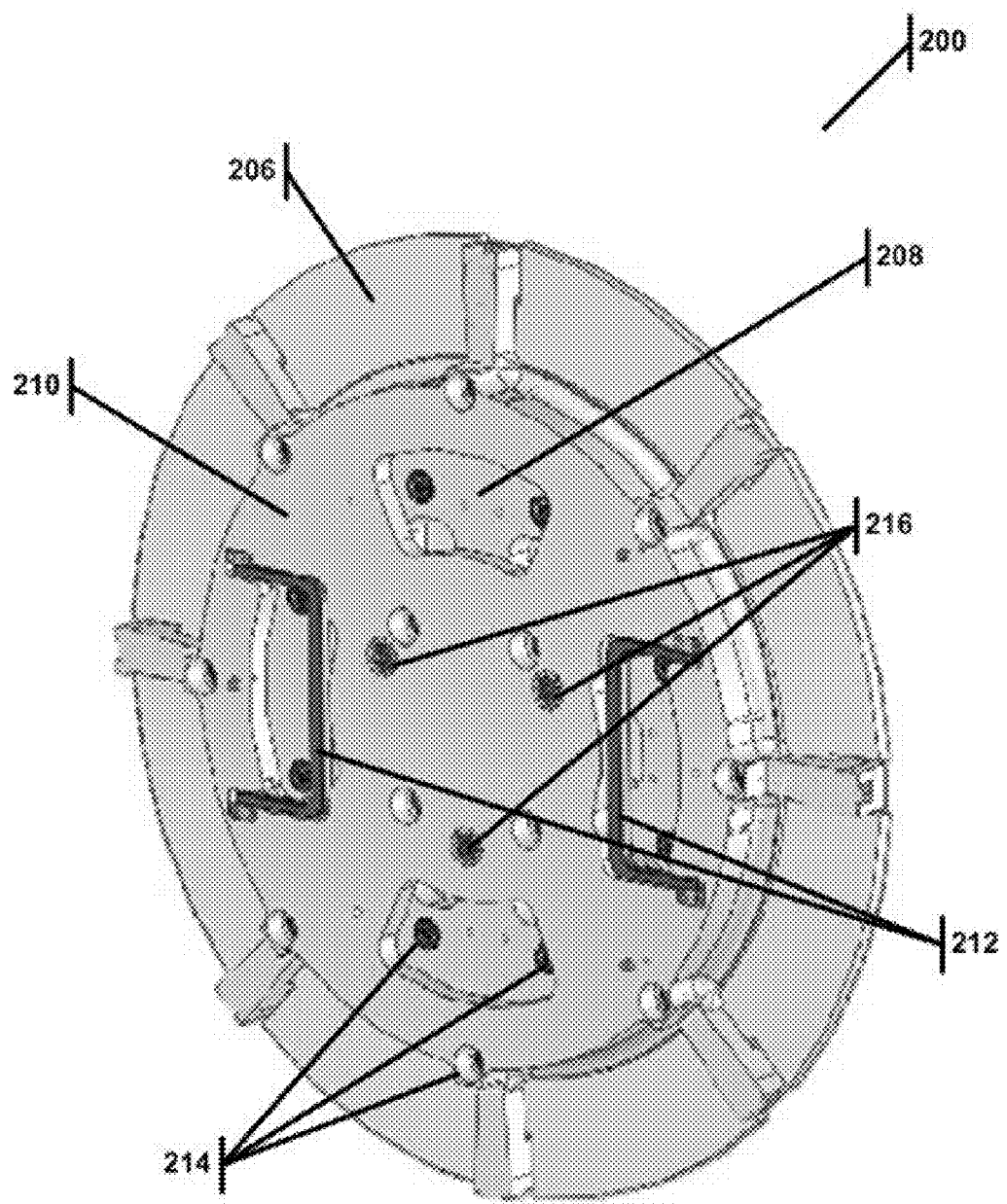
FIG. 2 shows a top perspective view of an exemplary probe card assembly according to some embodiments of the invention.
Figure 3:
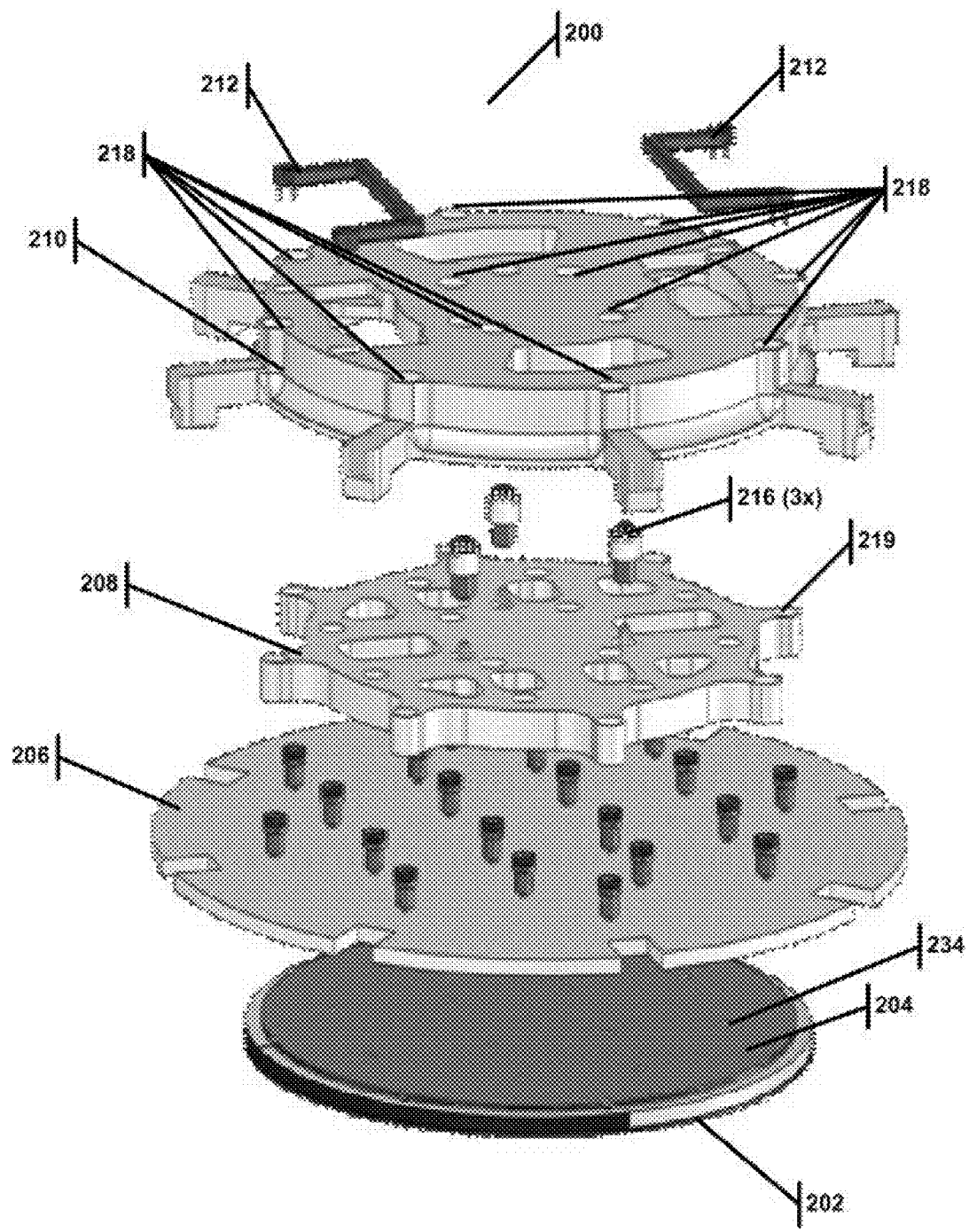
FIG. 3 shows an exploded view of the principal components of the exemplary probe card assembly of FIG. 2.
Figure 4:
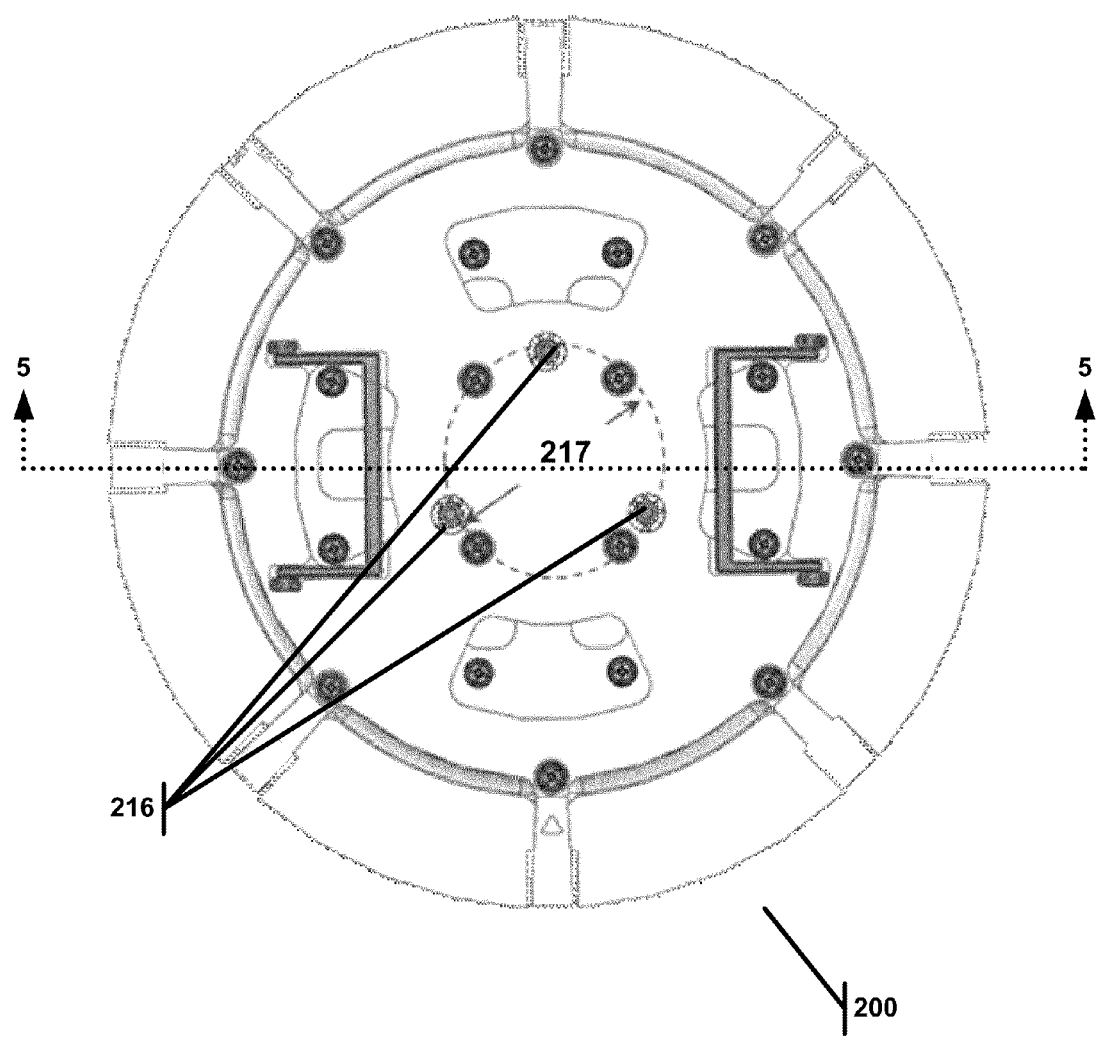
FIG. 4 shows a top plan view of the exemplary probe card assembly of FIG. 2.
Figure 5:
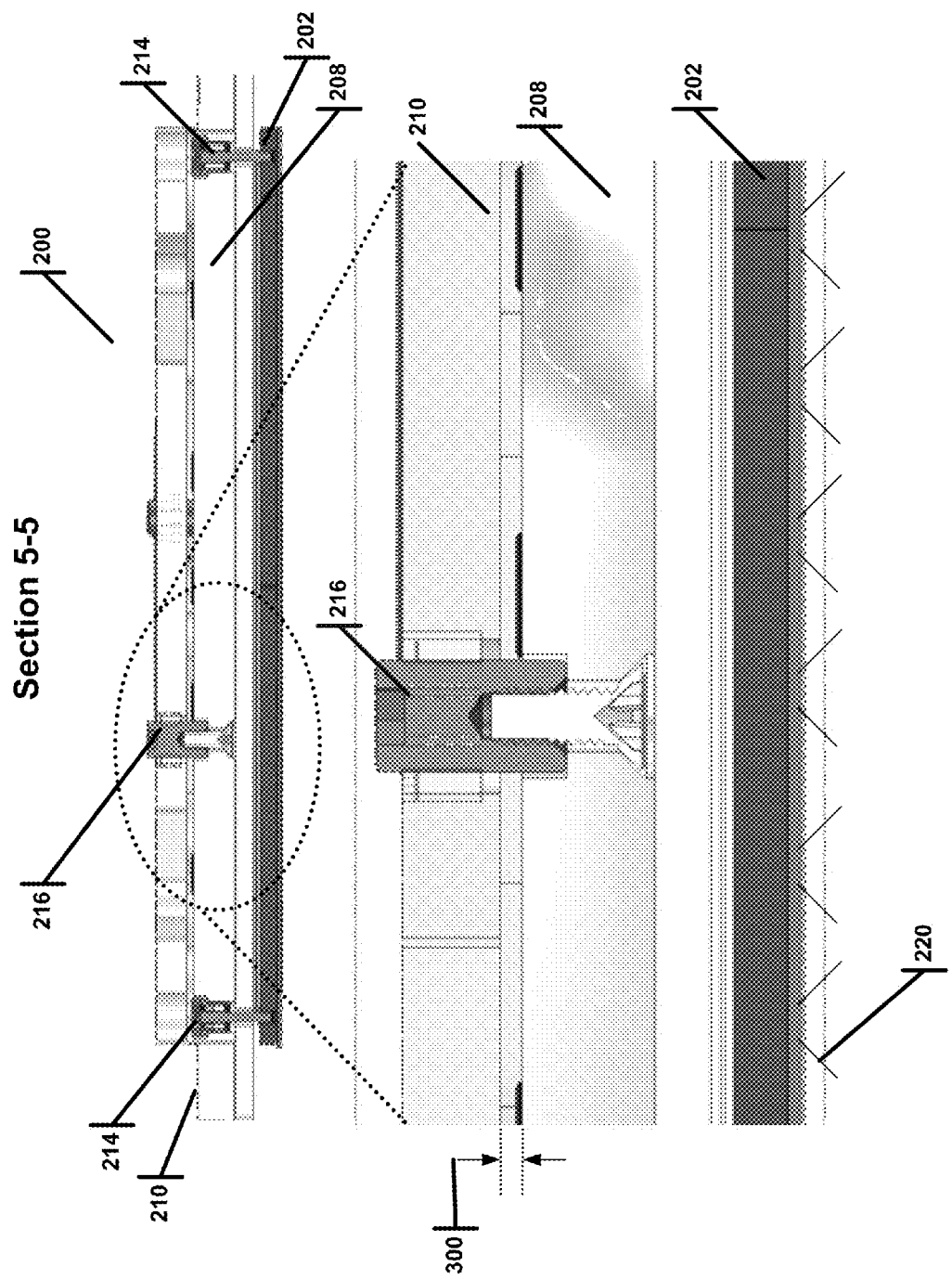
FIG. 5 illustrates a side cross-sectional view of the probe card assembly of FIG. 4, including a blow-up of a portion of that cross-section.

FIGS. 2 through 5 illustrate an exemplary probe card assembly 200 configured to resist "z" direction thermal movement according to some embodiments of the invention. (As used herein, movement includes movement, deformation, bending, warping, etc.) FIG. 2 is a top perspective view, FIG. 3 is an exploded assembly view, FIG. 4 is a top plan view and FIG. 5 is a side cross-sectional view of an example probe card assembly 200. (In FIGS. 2 and 4, the "x" direction is horizontal across the page, the "y" direction is vertical on the page, and the "z" direction, although shown slightly askew in FIG. 2, is perpendicular to—that is, into and out of—the page; in FIGS. 3 and 5, the "x" direction is horizontal across the page, the "y" direction, although shown slightly askew in FIG. 3, is perpendicular—that is, into and out of—the page, and the "z" direction is vertical on the page. These directions are provided for purposes of illustration and discussion only, however, and are not limiting.) Although not limited to use with the prober 102 and test head 104 of FIGS. 1A and 1B, the exemplary probe card assembly 200 may be used in a prober 102 and test head 104 like that of FIGS. 1A and 1B in place of probe card assembly 108.

The exemplary probe card or microelectronic contactor assembly 200 shown in FIG. 2 may in some cases be configured as a microelectronic wafer contactor assembly or probe card assembly (i.e., an assembly for contacting semiconductor devices on a wafer or die). The dies (not shown) to be tested can be dies of an unsingulated semiconductor wafer (e.g., like wafer 112 of FIG. 1A), singulated dies (e.g., held in a carrier (not shown)), dies forming a multi-chip module, or any other arrangement of dies to be tested. As described herein, a wiring substrate 206 can provide electrical connections to the probe head assembly 202, and inner and outer stiffener plates 208, 210 can provide mechanical and dimensional stability to the probe head assembly 202 and wiring substrate 206.

With reference to FIGS. 2 and 3, the example assembly 200 may comprise a probe head 202, a compressible electrical interconnect 204, a circuit board 206, an inner stiffener 208, an outer stiffener 210, handles 212 attached to the outer stiffener 210, a plurality of adjustable multi-part fasteners 214 connecting the probe head 202, electrical interconnect 204, and circuit board 206 to the inner stiffener 208. Adjustment mechanisms 216 may be provided for attaching the outer stiffener plate 210 to the inner stiffener plate 208, and for adjusting the position of the outer stiffener plate 210 with respect to the inner stiffener plate 208. The circuit board 206 may be disposed between the probe head 202 and the inner and outer stiffeners 208, 210, and the compressible electrical interconnect 204 may be disposed between the probe head 202 and the circuit board 206.

Mechanical fasteners 214 may comprise any suitable means for securing the probe head assembly 202 to the inner stiffener plate 208. For example, the mechanical fasteners 214 may be as simple as screws or bolts 214 that pass through clearance holes 218 in the outer stiffener 210, into threaded holes 219 in the inner stiffener plate, and engaging threaded holes 234 in the probe head assembly 202. In the embodiment shown, the clearance holes 218 in the outer stiffener 210 do not engage the fasteners 214, but rather provide access to the fasteners 214. Alternatively, the mechanical fasteners 214 may be more complicated structures that provide additional functions, for instance to control the orientation of the probe head assembly 202 (and thus the probes 220) with respect to the inner stiffener plate 208. Mechanical fasteners 214 may also comprise adjustment mechanisms 216, such as tilt-adjusting differential screws. The probe head 202 may include a plurality of inserts (not shown) anchored therein. As used herein, the term "insert" refers to a device that is anchored in another device (e.g., a probe head 202) by extending into a hole or recess in the other device. Example inserts and applications thereof applicable to the present disclosure are described more fully in U.S. patent application Ser. No. 12/709,268 entitled "MICROELECTRONIC CONTACTOR ASSEMBLY, STRUCTURES THEREOF, AND METHODS OF CONSTRUCTING SAME" filed on Feb. 19, 2010 and assigned to the same entity as the present application, the entire disclosure of which is incorporated herein by reference.

Adjustment mechanisms 216 may adjustably connect two distinct stiffener pieces 208, 210, for the purposes of adjustably defining the tilt or plane of the contactor tips (not shown) independent of any mechanical hardware affixing the probe-card assembly 200 to the tester 104 or prober 102 interface. Since three points define a plane, locating three tilt adjusting mechanisms 216 solely within the central region of the probe-card assembly 200 provides simple plane adjustment with increased sensitivity. For example, FIG. 4 provides a top plan view of the example assembly 200, showing an example placement of adjustment mechanisms 216, which in one embodiment are three in number, and are located equal-spaced around a relatively small bolt circle 217, which in one embodiment may be 110 millimeters in diameter. By way of reference, in the same embodiment the total thickness of the probecard assembly may be approximately 20 millimeters.

Operation of the differential screw mechanisms 216 can help maintain or adjust: (i) the planarity of a surface of the probe head 202; or (ii) the planarity of features (e.g., tips) of the microelectronic contactors 220. The probe card assembly 200 may include adjustment mechanisms 216 for adjusting the position of the inner stiffener plate 202 with respect to the outer stiffener plate 210. The adjustment mechanisms 216 can be differential screw assemblies, each including a screw that threads into a threaded nut that is itself threaded into the outer stiffener plate 210 as generally described in U.S. patent Ser. No. 12/709,268. That is, the screw may also thread into a threaded stud attached to the inner stiffener plate 202. Rotation of the nut in one direction pulls the threaded stud (and thus the portion of the inner stiffener plate 202 to which the stud is attached) toward the outer stiffener plate 210, and rotation of the nut in the opposite direction pushes the threaded stud (and thus the portion of the inner stiffener plate 202 to which the stud is attached) away from the outer stiffener plate 210. The use of three of such adjustment mechanisms 216 (e.g., differential screws) disposed evenly around and near the center of the outer stiffener plate 210 and the inner stiffener plate 202, allows the planar orientation of the inner stiffener plate 202 to be adjusted with respect to outer stiffener plate 210. In one embodiment the outside screw of adjustment mechanism 216 uses ¾-40 thread, while the inside screw of adjustment mechanism 216 uses ½-36 thread or ½-39 thread.

The use of differential screw assemblies as adjustment mechanisms 216 is exemplary only; other mechanisms for adjusting the planar orientation of the inner stiffener plate 202 with respect to the outer stiffener plate 210 may be used. For example, one or more of the differential screw assemblies (e.g., 216) may be replaced with a mechanism for only pushing the inner stiffener plate 202 away from the outer stiffener plate 210. For example, the threaded stud may be removed, such that the screw presses against the inner stiffener plate 202 or against a mechanical element (e.g., a metal ball) disposed between the screw and the inner stiffener plate 202. In such a configuration, turning the screw in a first direction causes the screw to press against the inner stiffener plate 202 and thus push the inner stiffener plate 202 away from the outer stiffener plate 210. Turning the screw the opposite direction, however, simply withdraws the screw from the inner stiffener plate 202 without pulling on the inner stiffener plate 202. A spring-loaded mechanism (not shown) can be provided to bias the inner stiffener plate 202 toward the outer stiffener plate 210. Regardless of the type of adjustment mechanism 216 used, more or fewer adjustment mechanisms 216 than shown in FIGS. 2 through 5 may be used in alternative embodiments.

Adjustment mechanisms 216 may be used to adjust the planar orientation and/or shape of the inner stiffener plate 202 with respect to the outer stiffener plate 210 after manufacture of the probe card assembly 200 and/or between uses of the probe card assembly 200 to test dies (not shown). In addition, the adjustment mechanisms 216 may be used to adjust the inner stiffener plate 202 before bolting the probe card assembly 200 to the test head plate 121 of a prober 102, while the probe card assembly 200 is bolted to the test head plate 121, or after removing the probe card assembly 200 from the test head plate 121.

The adjustment mechanisms 216 may also be used to adjust the inner stiffener plate 202 during testing of dies (not shown) to counteract thermally induced movement of the inner stiffener plate 202 (or any other portion of the probe card assembly 200). In response to detected movement of the probes 220 during testing of dies (not shown), the adjustment mechanisms 216 may be selectively activated to push or pull against selected regions of the inner stiffener plate 202 (as described above) to counteract the detected movement (that is, move the inner stiffener plate 202 such that the probes 220 move back into their desired positions).

Another benefit of locating the adjustment mechanisms 216 centrally, and thus constraining the inner and outer stiffeners 208, 210 to each other only near radial their centers, is that this allows independent radial expansion/contraction of the stiffeners 208, 210, which tends to minimize unwanted movement in the "z" direction (such as deformation, bending, and warping) when the inner and outer stiffeners 208, 210 expand and contract radially at different rates and/or to different extents. Such differential radial expansion may occur, for instance, when the inner and outer stiffeners 208, 210 are exposed to different amounts of heat, and/or are comprised of materials with different coefficients of thermal expansion (hereafter, "CTE"). In contrast to the present system, the outer stiffener or "truss structure 604" disclosed in U.S. Pat. No. 7,592,821 was mechanically bound to the "stiffener plate 202" by fasteners 614, not only in the central portion of the "probecard assembly 200," but also radially across the entire "stiffener plate 202" from side to side, as shown therein in FIG. 7A. Accordingly, to lessen the unwanted movement in the "z" direction inherent in such a mechanically-fused two-part stiffener system, U.S. Pat. No. 7,592,821 taught using a material with a lower CTE for the more-heated "stiffener plate 202," and a higher CTE for the less-heated outer stiffener or "truss structure 604."

The present system allows the inner and outer stiffeners 208, 210 to radially expand and contract independently by fixing them together only in a central location, largely avoiding the problems of having to predetermine temperature gradients across the stiffeners and then having to select a specific CTE for each stiffener to counteract the expected inequality in temperatures of the stiffeners 208, 210. By avoiding the problems associated with dimensionally fused stiffeners, the present system can utilize an inner stiffener 208 formed from a material with a high CTE, so that the inner stiffener 208 can expand similarly in the "x" and "y" directions to the thermally expansive and/or highly-heated components attached with fasteners 214 to the inner stiffener 208, such as the probe head 202, the compressible electrical interconnect 204, and/or the wiring substrate or circuit board 206. The inner stiffener 208 may be formed from a material that has significantly different mechanical properties (such as, for instance, CTE, heat capacity, thermal conductivity, strength, stiffness, etc.) from the outer stiffener 210. In one embodiment the inner stiffener 208 is formed from relatively high CTE material, such as, for instance, Grade 303 Stainless Steel, T6061 Aluminum, or even a suitable polymer or other material.

The outer stiffener 210, in contrast, need not be formed from a high CTE material since it can expand and contract independently from the inner stiffener 208. To provide a dimensionally stable interface with other components, such as, for example, prober 102 and test head 104 of FIGS. 1A and 1B, and to thereby minimize "x," "y" and "z" movements of the assembly 200, a low CTE material may be selected for the outer stiffener 210, such as, for example, Grade 416 Stainless Steel. In some embodiments, the outer stiffener 210 provides most of the strength, for instance where the inner stiffener 208 is formed from a relatively weaker material such as a polymer.

It should thus be apparent that the materials and geometries of stiffeners 208, 210 should be selected to have sufficient strength. For example, in various embodiments the stiffeners 208, 210 may comprise metal (e.g., aluminum), which is typically stronger and more resistant to movement, bowing, warping, etc. than a wiring substrate 206 would be (e.g., as discussed above, the wiring substrate 206 is typically made of printed circuit board materials). Other non-limiting examples of materials from which the stiffeners 208, 210 can be made include Grade 316 Stainless Steel, Aluminum and Aluminum alloys (such as, for instance, 7071, 3000, 5056 etc.), Titanium, Kovar, Invar steel, titanium, nickel, graphite epoxy, metal matrix materials, ceramics, etc. In addition, alloys of any of the foregoing materials or mixtures of any of the foregoing materials with other materials can be used. It should be apparent that the stiffeners 208, 210 can form part of a metallic structure that attaches the probe head assembly 202 to the prober head plate 121. Materials for the components of assembly 200 are selected to take advantage of thermally-induced (thermal gradient and/or differential CTE) deformation to produce optimal planarity of contactor tips or probes 220 at a desired temperature.

The inner and outer stiffeners 208, 210 may be aligned relative to each other using one ore more dowel pins (not shown), which may be removed after alignment.

As shown in FIG. 5, the probe head 202 may have a plurality of microelectronic contactors 220. These contactors, or probes 220 may be electrically connected to the circuit board 206, at least in part, by electrical connections that the compressible electrical interconnect 204 may provide between the probe head 202 and the circuit board 206. Probes 220 (or any of the probes discussed herein) can be resilient, conductive structures. Probes 220 may be a resilient, conductive structure. Non-limiting examples of suitable probes 220 include composite structures formed of a core wire bonded to a conductive terminal (not shown) on a probe head assembly (e.g., like probe head 202) that is over coated with a resilient material as described in U.S. Pat. Nos. 5,476,211, 5,917,707, and 6,336,269, all of which are incorporated herein by reference. Probes 220 may alternatively be lithographically formed structures, such as the spring elements disclosed in U.S. Pat. Nos. 5,994,152, 6,033,935, 6,255,126, 6,945,827, U.S. Patent Application Publication No. 2001/0044225, and U.S. Patent Application Publication No. 2004/0016119, all of which are incorporated herein by reference. Still other non-limiting examples of probes 220 are disclosed in U.S. Pat. Nos. 6,827,584, 6,640,432, U.S. Pat. No. 6,441,315, and U.S. Patent Application Publication No. 2001/0012739, all of which are incorporated herein by reference. Other non-limiting examples of probes 220 include conductive pogo pins, bumps, studs, stamped springs, needles, buckling beams, etc.

Also as shown in FIG. 5, the adjustment mechanisms 216 may be adjusted to provide a gap 300 between the inner and outer stiffeners, 208, 210. In one embodiment the gap 300 may be, for example, about two (2) millimeters.

In use, electrical signals may be transmitted between one or more devices connected to the microelectronic contactors 220 and equipment connected to the circuit board 206. By way of example, the circuit board 206 may be provided with electrical contacts or connectors (not shown) for electrically connecting the circuit board 206 to other equipment. In some embodiments, the device(s) connected to the microelectronic contactors 220 may be semiconductor devices under test (DUTs), such as semiconductor chips on a wafer, and the equipment to which the circuit board 206 is connected may be test equipment such as automated test equipment (ATE).

Although exemplary embodiments and applications of the invention have been described herein, there is no intention that the invention be limited to these exemplary embodiments and applications or to the manner in which the exemplary embodiments and applications operate or are described herein. Indeed, many variations and modifications to the exemplary embodiments are possible. For example, although each of the embodiments is described herein in the context of testing semiconductor dies, the invention is not so limited but is applicable to any apparatus, system, or scenario in which a device is tested or monitored by probing the device.

What is claimed is:

1. A method of maintaining contact between a plurality of microelectronic contactors and terminals of semiconductor devices, the method comprising:
   coupling a probe card assembly to a prober machine for testing semiconductor devices, the probe card assembly comprising:
   a plurality of microelectronic contactors for contacting terminals of semiconductor devices to test the semiconductor devices, the plurality of microelectronic contactors being attached to a probe head;
   a stiffener assembly for providing mechanical support to the microelectronic contactors and for connecting the probe card assembly to the prober machine, the stiffener assembly comprising a first stiffener body with a first central portion and a second stiffener body with a second central portion, the first stiffener body and the second stiffener body being mechanically connected together in only the first central portion and the second central portion;

the probe head being attached to the first stiffener body at a plurality of locations outside the first central portion of the first stiffener body;

the second stiffener body being attached to the prober machine at a plurality of locations outside the second central portion of the second stiffener body;

causing the probe head and the first stiffener body to which the probe head is attached to expand or contract thermally a first percentage substantially in a first plane so that the ones of the probes and the ones of the terminals of the semiconductor devices maintain sufficient alignment to maintain said contact as the semiconductor devices expand or contract thermally; and simultaneously causing the second stiffener body which is attached to the prober machine to expand or contract thermally a second percentage substantially in a second plane substantially parallel to the first plane.

2. The method of claim 1, wherein the second percentage is less than the first percentage.

3. The method of claim 1, wherein the first stiffener body and the second stiffener body are mechanically connected together with at least one adjustment mechanism, further comprising the step of adjusting the position of the first stiffener body relative to the second stiffener body using the at least one adjustment mechanism.

4. The method of claim 1, wherein the first stiffener body and the second stiffener body are mechanically connected together with three adjustment mechanisms, further comprising the step of adjusting the position of the first stiffener body relative to the second stiffener body using at least one of the adjustment mechanisms.

5. The method of claim 1, wherein the first stiffener body and the second stiffener body are mechanically connected together with three approximately equally-spaced adjustment mechanisms, further comprising the step of adjusting the position of the first stiffener body relative to the second stiffener body using at least one of the adjustment mechanisms.

6. The method of claim 1, wherein the first stiffener body and the second stiffener body are mechanically connected together with at least one adjustment mechanism that comprises a differential screw mechanism, further comprising the step of adjusting the position of the first stiffener body relative to the second stiffener body using the at least one differential screw mechanism.

7. The method of claim 1, wherein the first stiffener body and the second stiffener body are mechanically connected together with three adjustment mechanisms, that comprise differential screw mechanisms, further comprising the step of adjusting the position of the first stiffener body relative to the second stiffener body using at least one of the differential screw mechanisms.

8. The method of claim 1, wherein the first stiffener body and the second stiffener body are mechanically connected together with three approximately equally-spaced adjustment mechanisms that comprise differential screw mechanisms, further comprising the step of adjusting the position of the first stiffener body relative to the second stiffener body using at least one of the differential screw mechanisms.

9. A microelectronic contactor assembly, comprising:

a probe head comprising a plurality of microelectronic contactors for contacting terminals of semiconductor devices to test the semiconductor devices, the plurality of microelectronic contactors being attached to a probe head;

a stiffener assembly for providing mechanical support to the microelectronic contactors and for connecting the probe card assembly to a prober machine, the stiffener assembly comprising a first stiffener body with a first central portion and a second stiffener body with a second central portion, the first stiffener body and the second stiffener body being mechanically connected together in only the first central portion and the second central portion;

the probe head being attached to the first stiffener body at a plurality of locations outside the first central portion of the first stiffener body;

the second stiffener body being adapted to be attached to the prober machine at a plurality of locations outside the second central portion of the second stiffener body; and wherein the first stiffener body and the second stiffener body are mechanically connected together with at least one adjustment mechanism.

10. The microelectronic contactor assembly of claim 9, further comprising:

a circuit board disposed between the probe head and the first stiffener body.

11. The microelectronic contactor assembly of claim 9, further comprising:

a circuit board disposed between the probe head and the first stiffener body; and a compressible electrical interconnect disposed between the probe head and the circuit board, the compressible electrical interconnect providing electrical interconnections between the probe head and the circuit board.

12. The microelectronic contactor assembly of claim 9, wherein the first stiffener body has a first coefficient of thermal expansion, and the second stiffener body has a second coefficient of thermal expansion.

13. The microelectronic contactor assembly of claim 9, wherein the first stiffener body has a first coefficient of thermal expansion, the second stiffener body has a second coefficient of thermal expansion, and the first coefficient of thermal expansion is greater than the second coefficient of thermal expansion.

14. The microelectronic contactor assembly of claim 9, wherein the first stiffener body and the second stiffener body are mechanically connected together with three adjustment mechanisms.

15. The microelectronic contactor assembly of claim 9, wherein the first stiffener body and the second stiffener body are mechanically connected together with three approximately equally-spaced adjustment mechanisms.

16. The microelectronic contactor assembly of claim 9, wherein the first stiffener body and the second stiffener body are mechanically connected together with at least one adjustment mechanism that comprises a differential screw mechanism.

17. The microelectronic contactor assembly of claim 9, wherein the first stiffener body and the second stiffener body are mechanically connected together with three adjustment mechanisms that comprise differential screw mechanisms.

18. The microelectronic contactor assembly of claim 9, wherein the first stiffener body and the second stiffener body are mechanically connected together with three approximately equally-spaced adjustment mechanisms that comprise differential screw mechanisms.

19. A method of adjusting the position of a plurality of microelectronic contactors relative to a prober machine for testing semiconductor devices, the method comprising:

coupling a probe card assembly to a prober machine for testing semiconductor devices, the probe card assembly comprising:
- a plurality of microelectronic contactors for contacting terminals of semiconductor devices to test the semiconductor devices, the plurality of microelectronic contactors being attached to a probe head;
- a stiffener assembly for providing mechanical support to the microelectronic contactors and for connecting the probe card assembly to the prober machine, the stiffener assembly comprising a first stiffener body with a first central portion and a second stiffener body with a second central portion, the first stiffener body and the second stiffener body being mechanically connected together in only the first central portion and the second central portion with three approximately equally-spaced adjustment mechanisms that comprise differential screw mechanisms;
- the probe head being attached to the first stiffener body at a plurality of locations outside the first central portion of the first stiffener body;
- the second stiffener body being attached to the prober machine at a plurality of locations outside the second central portion of the second stiffener body; and
- adjusting the position of the first stiffener body relative to the second stiffener body using at least one of the differential screw mechanisms.

* * * * *